United States Patent
Reiss et al.

(10) Patent No.: US 10,414,947 B2
(45) Date of Patent: *Sep. 17, 2019

(54) POLISHING COMPOSITION CONTAINING CERIA PARTICLES AND METHOD OF USE

(71) Applicant: Cabot Microelectronics Corporation, Aurora, IL (US)

(72) Inventors: Brian Reiss, Woodridge, IL (US); Viet Lam, Naperville, IL (US); Renhe Jia, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 284 days.

This patent is subject to a terminal disclaimer.

(21) Appl. No.: 15/056,198

(22) Filed: Feb. 29, 2016

(65) Prior Publication Data

US 2016/0257855 A1   Sep. 8, 2016

Related U.S. Application Data

(60) Provisional application No. 62/128,802, filed on Mar. 5, 2015.

(51) Int. Cl.
| | |
|---|---|
| *C09G 1/02* | (2006.01) |
| *B24B 37/04* | (2012.01) |
| *H01L 21/306* | (2006.01) |
| *H01L 21/3105* | (2006.01) |
| *C01F 17/00* | (2006.01) |
| *C09K 3/14* | (2006.01) |

(52) U.S. Cl.
CPC .............. *C09G 1/02* (2013.01); *B24B 37/044* (2013.01); *C01F 17/0043* (2013.01); *C09K 3/1409* (2013.01); *C09K 3/1463* (2013.01); *H01L 21/30625* (2013.01); *H01L 21/31053* (2013.01); *C01P 2002/82* (2013.01); *C01P 2004/51* (2013.01); *C01P 2004/62* (2013.01); *C01P 2004/64* (2013.01); *C01P 2006/12* (2013.01)

(58) Field of Classification Search
CPC ....................................................... C09G 1/02
See application file for complete search history.

(56) References Cited

U.S. PATENT DOCUMENTS

| | | |
|---|---|---|
| 5,196,353 A | 3/1993 | Sandhu et al. |
| 5,433,651 A | 7/1995 | Lustig et al. |
| 5,609,511 A | 3/1997 | Moriyama et al. |
| 5,643,046 A | 7/1997 | Katakabe et al. |
| 5,658,183 A | 8/1997 | Sandhu et al. |
| 5,730,642 A | 3/1998 | Sandhu et al. |
| 5,838,447 A | 11/1998 | Hiyama et al. |
| 5,872,633 A | 2/1999 | Holzapfel et al. |
| 5,893,796 A | 4/1999 | Birang et al. |
| 5,949,927 A | 9/1999 | Tang |
| 5,964,643 A | 10/1999 | Birang et al. |
| 7,044,836 B2 | 5/2006 | Sun et al. |
| 7,470,295 B2 | 12/2008 | Kim et al. |
| 8,138,091 B2 | 3/2012 | Dysard et al. |
| 8,486,169 B2 | 7/2013 | Carter et al. |
| 8,617,275 B2 | 12/2013 | Hoshi et al. |
| 2004/0065022 A1 | 4/2004 | Machii et al. |
| 2004/0152309 A1 | 8/2004 | Carter et al. |
| 2006/0075688 A1 | 4/2006 | Takenouchi |
| 2006/0096179 A1 | 5/2006 | Lu et al. |
| 2012/0129346 A1 | 5/2012 | Ryuzaki et al. |
| 2013/0244433 A1 | 9/2013 | Reiss et al. |
| 2014/0152309 A1 | 6/2014 | Kozlov et al. |
| 2015/0017806 A1 | 1/2015 | Akutsu et al. |

FOREIGN PATENT DOCUMENTS

WO    2013125446 A1    8/2013

*Primary Examiner* — Roberts P Culbert
(74) *Attorney, Agent, or Firm* — Thomas Omholt; Erika S. Wilson; Ashlee B. Szelag

(57) ABSTRACT

The invention provides a chemical-mechanical polishing composition including wet-process ceria particles having a median particle size of about 25 nm to about 150 nm and a particle size distribution of about 300 nm or more, and an aqueous carrier. The invention also provides a method of polishing a substrate, especially a substrate comprising a silicon layer, with the polishing composition.

20 Claims, No Drawings

POLISHING COMPOSITION CONTAINING CERIA PARTICLES AND METHOD OF USE

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., a silicon oxide) conforms to the underlying topography of the substrate. Thus, the surface of the substrate is characterized by raised areas of the overlying oxide between trenches, which are referred to as pattern oxide. Pattern oxide is characterized by the step height of the excess oxide dielectric material lying outside of the trenches. The excess dielectric material is typically removed by a CMP process, which additionally provides a planar surface for further processing. As pattern oxide is abraded and planarity of the surface is approached, the oxide layer is then referred to as blanket oxide.

A polishing composition can be characterized according to its polishing rate (i.e., removal rate) and its planarization efficiency. The polishing rate refers to the rate of removal of a material from the surface of the substrate and is usually expressed in terms of units of length (thickness) per unit of time (e.g., Angstroms (Å) per minute). Planarization efficiency relates to step height reduction versus amount of material removed from the substrate. Specifically, a polishing surface, e.g., a polishing pad, first contacts the "high points" of the surface and must remove material in order to form a planar surface. A process that results in achieving a planar surface with less removal of material is considered to be more efficient than a process requiring removal of more material to achieve planarity.

Often the rate of removal of the silicon oxide pattern can be rate-limiting for the dielectric polishing step in STI processes, and therefore high removal rates of the silicon oxide pattern are desired to increase device throughput. However, if the blanket removal rate is too rapid, overpolishing of oxide in exposed trenches results in trench erosion and increased device defectivity.

A need remains for compositions and methods for chemical-mechanical polishing of silicon substrates, especially silicon oxide-containing substrates that will provide useful removal rates while also providing improved planarization efficiency. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising (a) wet-process ceria particles having a median particle size of about 25 nm to about 150 nm and a particle size distribution of about 300 nm or more, and (b) an aqueous carrier.

The invention also provides a method of polishing a substrate comprising (i) providing a substrate, such as a substrate comprising a silicon layer; (ii) providing a polishing pad; (iii) providing a chemical-mechanical polishing composition comprising (a) wet-process ceria particles having a median particle size of about 25 nm to about 150 nm and a particle size distribution of about 300 nm or more, and (b) an aqueous carrier; (iv) contacting the substrate with the polishing pad and the chemical-mechanical polishing composition; and (v) moving the polishing pad and the chemical-mechanical polishing composition relative to the substrate, such as the silicon layer on a surface of the substrate, to abrade at least a portion of the substrate to polish the substrate.

DETAILED DESCRIPTION OF THE INVENTION

The invention provides a chemical-mechanical polishing composition comprising, consisting essentially of, or consisting of (a) wet-process ceria particles having a median particle size of about 25 nm to about 150 nm and a particle size distribution of about 300 nm or more, and (b) an aqueous carrier.

The polishing composition comprises wet-process ceria particles. The wet-process ceria particles can be any suitable wet-process ceria particles. For example, the wet-process ceria particles can be precipitated ceria particles or condensation-polymerized ceria particles, including colloidal ceria particles.

The wet-process ceria particles can be made by any suitable process. Typically, the first step in synthesizing wet-process ceria particles according to the invention is to dissolve a ceria precursor in water. The ceria precursor can be any suitable ceria precursor, and can include a ceria salt having any suitable charge, e.g., $Ce^{3+}$ or $Ce^{4+}$. Suitable ceria precursors include, for example, cerium III nitrate, cerium IV ammonium nitrate, cerium III carbonate, cerium IV sulfate, and cerium III chloride. Preferably, the ceria precursor is cerium III nitrate.

The pH of the ceria precursor solution typically is increased to form amorphous $Ce(OH)_3$. The pH of the solution can be increased to any suitable pH. For example, the pH of the solution can be increased to a pH of about 10 or more, e.g., a pH of about 10.5 or more, a pH of about 11 or more, or a pH of about 12 or more. Typically, the solution will have a pH of about 14 or less, e.g., a pH of about 13.5 or less, or a pH of about 13 or less. Any suitable base can be used to increase the pH of the solution. Suitable bases include, for example, KOH, NaOH, $NH_4OH$, and tetramethylammonium hydroxide. Organic bases such as, for example, ethanolamine and diethanolamine, also are suitable. The solution will become white and cloudy as the pH increases and amorphous $Ce(OH)_3$ is formed.

The ceria precursor solution typically is mixed for several hours. For example, the solution can be mixed for about 1 hour or more, e.g., about 2 hours or more, about 4 hours or more, about 6 hours or more, about 8 hours or more, about 12 hours or more, about 16 hours or more, about 20 hours or more, or about 24 hours or more. Typically, the solution is mixed for about 1 hour to about 24 hours, e.g., about 2 hours, about 8 hours, or about 12 hours. When mixing is complete, the solution can be transferred to a pressurized vessel and heated.

The ceria precursor solution can be heated to any suitable temperature. For example, the solution can be heated to a temperature of about 50° C. or more, e.g., about 75° C. or more, about 100° C. or more, about 125° C. or more, about 150° C. or more, about 175° C. or more, or about 200° C. or more. Alternatively, or in addition, the solution can be heated to a temperature of about 500° C. or less, e.g., about 450° C. or less, about 400° C. or less, about 375° C. or less, about 350° C. or less, about 300° C. or less, about 250° C. or less, about 225° C., or about 200° C. or less. Thus, the solution can be heated to a temperature within a range bounded by any two of the aforementioned endpoints. For example, the solution can be heated to a temperature of about 50° C. to about 300° C., e.g., about 50° C. to about 275° C., about 50° C. to about 250° C., about 50° C. to about 200° C., about 75° C. to about 300° C., about 75° C. to about 250° C., about 75° C. to about 200° C., about 100° C. to about 300° C., about 100° C. to about 250° C., or about 100° C. to about 225° C.

The ceria precursor solution typically is heated for several hours. For example, the solution can be heated for about 1 hour or more, e.g., about 5 hours or more, about 10 hours or more, about 25 hours or more, about 50 hours or more, about 75 hours or more, about 100 hours or more, or about 110 hours or more. Alternatively, or in addition, the solution can be heated for about 200 hours or less, e.g., about 180 hours or less, about 165 hours or less, about 150 hours or less, about 125 hours or less, about 115 hours or less, or about 100 hours or less. Thus, the solution can be heated for a time period bounded by any two of the aforementioned endpoints. For example, the solution can be heated for about 1 hour to about 150 hours, e.g., about 5 hours to about 130 hours, about 10 hours to about 120 hours, about 15 hours to about 115 hours, or about 25 hours to about 100 hours.

After heating, the ceria precursor solution can be filtered to separate the precipitated ceria particles. The precipitant can be rinsed with excess water to remove unreacted ceria precursor. The mixture of precipitant and excess water can be filtered following each rinse step to remove impurities. Once adequately rinsed, the ceria particles can be dried for additional processing, e.g., sintering, or the ceria particles can be directly redispersed.

The ceria particles optionally can be dried and sintered prior to redispersion. The terms "sintering" and "calcining" are used interchangeably herein to refer to the heating of the ceria particles under the conditions described below. Sintering the ceria particles impacts their resulting crystallinity. Without wishing to be bound by any particular theory, it is believed that sintering the ceria particles at high temperatures and for extended periods of time reduces defects in the crystal lattice structure of the particles. Any suitable method can be used to sinter the ceria particles. As an example, the ceria particles can be dried, and then can be sintered at an elevated temperature. Drying can be carried out at room temperature, or at an elevated temperature. In particular, drying can be carried out at a temperature of about 20° C. to about 40° C., e.g., about 25° C., about 30° C., or about 35° C. Alternatively, or in addition, drying can be carried out at an elevated temperature of about 80° C. to about 150° C., e.g., about 85° C., about 100° C., about 115° C., about 125° C., or about 140° C. After the ceria particles have been dried, they can be ground to create a powder. Grinding can be carried out using any suitable grinding material, such as zirconia.

The ceria particles can be sintered in any suitable oven, and at any suitable temperature. For example, the ceria particles can be sintered at a temperature of about 200° C. or more, e.g., about 215° C. or more, about 225° C. or more, about 250° C. or more, about 275° C. or more, about 300° C. or more, about 350° C. or more, or about 375° C. or more. Alternatively, or in addition, the ceria particles can be sintered at a temperature of about 1000° C. or less, e.g., about 900° C. or less, about 750° C. or less, about 650° C. or less, about 550° C. or less, about 500° C. or less, about 450° C. or less, or about 400° C. or less. Thus, the ceria particles can be sintered at a temperature bounded by any two of the aforementioned endpoints. For example, the ceria particles can be sintered at a temperature of about 200° C. to about 1000° C., e.g., about 250° C. to about 800° C., about 300° C. to about 700° C., about 325° C. to about 650° C., about 350° C. to about 600° C., about 350° C. to about 550° C., about 400° C. to about 550° C., about 450° C. to about 800° C., about 500° C. to about 1000° C., or about 500° C. to about 800° C.

The ceria particles can be sintered for any suitable length of time. For example, the ceria particles can be sintered for about 1 hour or more, e.g., about 2 hours or more, about 5 hours or more, or about 8 hours or more. Alternatively, or in addition, the ceria particles can be sintered for about 20 hours or less, e.g., about 18 hours or less, about 15 hours or less, about 12 hours or less, or about 10 hours or less. Thus, the ceria particles can be sintered for a time period bounded by any two of the aforementioned endpoints. For example, the ceria particles can be sintered for about 1 hour to about 20 hours, e.g., about 1 hour to about 15 hours, about 1 hour to about 10 hours, about 1 hour to about 5 hours, about 5 hours to about 20 hours, or about 10 hours to about 20 hours.

The ceria particles also can be sintered at various temperatures and for various lengths of time within the ranges described above. For example, the ceria particles can be sintered in a zone furnace, which exposes the ceria particles to one or more temperatures for various lengths of time. As an example, the ceria particles can be sintered at a temperature of about 200° C. to about 1000° C. for about 1 hour or more, and then can be sintered at a different temperature that is within the range of about 200° C. to about 1000° C. for about 1 hour or more.

The ceria particles typically are redispersed in a suitable carrier, e.g., an aqueous carrier, particularly water. If the ceria particles are sintered, then the ceria particles are redispersed after the completion of sintering. Any suitable process can be used to redisperse the ceria particles. Typically, the ceria particles are redispersed by lowering the pH of a mixture of the ceria particles and water using a suitable acid. As the pH is lowered, the surface of the ceria particles develops a cationic zeta potential. This cationic zeta potential creates repulsion forces between the ceria particles, which facilitates their redispersion. Any suitable acid can be used to lower the pH of the mixture. Suitable acids include, for example hydrochloric acid and nitric acid. Organic acids which are highly water-soluble and have hydrophilic functional groups also are suitable. Suitable organic acids include, for example, acetic acid. Acids with multivalent anions, such as $H_3PO_4$ and $H_2SO_4$, generally are not preferred. The pH of the mixture can be lowered to any suitable pH. For example, the pH of the mixture can be lowered to about 2 to about 5, e.g., about 2.5, about 3, about 3.5, about 4, or about 4.5. Typically, the pH of the mixture is not lowered to less than about 2.

The redispersed ceria particles typically are milled to reduce their particle size. Preferably, the ceria particles are milled simultaneously with redispersion. Milling can be carried out using any suitable milling material, such as zirconia. Milling also can be carried out using sonication or wet-jet procedures. After milling, the ceria particles can be filtered to remove any remaining large particles. For example, the ceria particles can be filtered using a filter having a pore size of about 0.3 μm or more, e.g., about 0.4 μm or more, or about 0.5 μm or more.

The wet-process ceria particles have a median particle size of about 25 nm to about 150 nm. The particle size of a particle is the diameter of the smallest sphere that encompasses the particle. The particle size of the wet-process ceria particles can be measured using any suitable technique. For example, the particle size of the wet-process ceria particles can be measured using a disc centrifuge, i.e., by differential centrifugal sedimentation (DCS). Suitable disc centrifuge particle size measurement instruments are commercially available, such as from CPS Instruments (Prairieville, La.), e.g., CPS Disc Centrifuge Model DC24000UHR. Unless specified otherwise, the median particle size values reported and claimed herein are based on disc centrifuge measurements.

For example, the wet-process ceria particles can have a median particle size of about 25 nm or more, e.g., about 30 nm or more, about 35 nm or more, about 40 nm or more, about 45 nm or more, about 50 nm or more, about 55 nm or more, about 60 nm or more, about 65 nm or more, or about 70 nm or more. Alternatively, or in addition, the wet-process ceria particles can have a median particle size of about 150 nm or less, e.g., about 145 nm or less, about 140 nm or less, about 135 nm or less, about 125 nm or less, about 120 nm or less, about 115 nm or less, about 105 nm or less, about 100 nm or less, about 90 nm or less, about 85 nm or less, or about 75 nm or less. Thus, the wet-process ceria particles can have a median particle size within a range bounded by any two of the aforementioned endpoints. For example, the wet-process ceria particles can have a median particle size of about 25 nm to about 150 nm, e.g., about 35 nm to about 140 nm, about 40 nm to about 135 nm, about 40 nm to about 100 nm, about 50 nm to about 125 nm, about 50 nm to about 100 nm, about 60 nm to about 140 nm, about 60 nm to about 125 nm, about 60 nm to about 100 nm, about 60 nm to about 90 nm, or about 60 nm to about 80 nm.

Preferably, the wet-process ceria particles have a median particle size of about 40 nm to about 100 nm, e.g., a median particle size of about 45 nm, a median particle size of about 50 nm, a median particle size of about 55 nm, a median particle size of about 75 nm, a median particle size of about 85 nm, a median particle size of about 90 nm, or a median particle size of about 95 nm. More preferably the wet-process ceria particles have a median particle size of about 60 nm to about 80 nm, e.g., a median particle size of about 65 nm, a median particle size of about 70 nm, or a median particle size of about 75 nm.

The wet-process ceria particles have a particle size distribution of about 300 nm or more. The particle size distribution refers to the difference between the particle size of the largest particle and the particle size of the smallest particle. For example, the wet-process ceria particles can have a particle size distribution of about 300 nm or more, e.g., about 315 nm or more, about 320 nm or more, about 325 nm or more, about 335 nm or more, about 350 nm or more, about 360 nm or more, or about 375 nm or more. Typically, the wet-process ceria particles will have a particle size distribution of about 500 nm or less, e.g., about 475 nm or less, about 450 nm or less, about 425 nm or less, or about 415 nm or less. Thus, the wet-process ceria particles can have a particle size distribution within a range bounded by any two of the aforementioned endpoints. For example, the wet-process ceria particles can have a particle size distribution of about 300 nm to about 500 nm, e.g., about 315 nm to about 475 nm, about 315 to about 415 nm, about 325 nm to about 475 nm, about 350 nm to about 475 nm, about 350 nm to about 415 nm, about 375 nm to about 475 nm, or about 375 nm to about 415 nm.

Preferably, the wet-process ceria particles have a particle size distribution of about 350 nm or more, e.g., a particle size distribution of about 355 nm, a particle size distribution of about 360 nm, a particle size distribution of about 365 nm, or a particle size distribution of about 370 nm. More preferably, the wet-process ceria particles have a particle size distribution of about 375 nm or more, e.g., a particle size distribution of about 380 nm, a particle size distribution of about 385 nm, a particle size distribution of about 390 nm, or a particle size distribution of about 400 nm.

The wet-process ceria particles can have any suitable largest particle size and any suitable smallest particle size, as long as the particle size distribution of the wet-process ceria particles is about 300 nm or more.

For example, the wet-process ceria particles can have a smallest particle size of about 1 nm to about 50 nm, e.g., about 1 nm to about 40 nm, about 1 nm to about 30 nm, about 1 nm to about 25 nm, about 1 nm to about 20 nm, about 5 nm to about 25 nm, or about 10 nm to about 25 nm. Preferably, the wet-process ceria particles have a smallest particle size of about 10 nm to about 30 nm, e.g., about 15 nm, about 20 nm, or about 25 nm.

The wet-process ceria particles can have a largest particle size of about 250 nm to about 500 nm, e.g., about 250 nm to about 450 nm, about 250 nm to about 400 nm, about 300 nm to about 500 nm, or about 300 nm to about 400 nm. Preferably, the wet-process ceria particles have a largest particle size of about 350 nm to about 450 nm, e.g., about 375 nm, about 400 nm, or about 425 nm.

The wet-process ceria particles can be present in the polishing composition at any suitable concentration. For example, the wet-process ceria particles can be present in the polishing composition at a concentration of about 0.005 wt. % to about 2 wt. %. In particular, the wet-process ceria particles can be present in the polishing composition at a concentration of about 0.005 wt. % or more, e.g., about 0.0075 wt. % or more, about 0.01 wt. % or more, about 0.025 wt. % or more, about 0.05 wt. % or more, about 0.075 wt. % or more, about 0.1 wt. % or more, or about 0.25 wt. % or more. Alternatively, or in addition, the wet-process ceria particles can be present in the polishing composition at a concentration of about 2 wt. % or less, e.g., about 1.75 wt. % or less, about 1.5 wt. % or less, about 1.25 wt. % or less, about 1 wt. % or less, about 0.75 wt. % or less, about 0.5 wt. % or less, or about 0.25 wt. % or less. Thus, the wet-process ceria particles can be present in the polishing composition a concentration within a range bounded by any two of the aforementioned endpoints. For example, the wet-process ceria particles can be present in the polishing composition at a concentration of about 0.005 wt. % to about 2 wt. %, e.g., about 0.005 wt. % to about 1.75 wt. %, about 0.005 wt. % to about 1.5 wt. %, about 0.005 wt. % to about 1.25 wt. %, about 0.005 wt. % to about 1 wt. %, about 0.01 wt. % to about 2 wt. %, about 0.01 wt. % to about 1.5 wt. %, about 0.05 wt. % to about 2 wt. %, about 0.05 wt. % to about 1.5 wt. %, about 0.1 wt. % to about 2 wt. %, about 0.1 wt. % to about 1.5 wt. %, or about 0.1 wt. % to about 1 wt. %.

Preferably, the wet-process ceria particles are present in the polishing composition at a concentration of about 0.1 wt. % to about 1 wt. %, e.g., about 0.15 wt. % to about 0.9 wt. %, about 0.2 wt. % to about 0.8 wt. %, or about 0.25 wt. % to about 0.75 wt. %. More preferably, the wet-process ceria particles are present in the polishing composition at a concentration of about 0.2 wt. % to about 0.6 wt. %, e.g., about 0.25 wt. %, about 0.35 wt. %, about 0.4 wt. %, about 0.45 wt. %, about 0.5 wt. %, or about 0.55 wt. %.

Ceria particles have three predominant types of hydroxyl groups on their surfaces, as follows:

TABLE 1

Characterization of Hydroxyl Groups Present on the Surface of Ceria Particles

| Hydroxyl Group Type | Abbreviation | $pK_a$ |
|---|---|---|
| Monodentate | Ce—OH | 24 |
| Bidentate | $Ce_2$—OH | 14.8 |
| Tridentate | $Ce_3$—OH | 5.5 |

As shown in Table 1, the hydroxyl groups on the surface of the ceria particles have different $pK_a$ values. As a result of their different $pK_a$ values, the hydroxyl groups have different reactivities. Without wishing to be bound by any particular theory, it is believed that ceria particles contain predominately bidentate hydroxyl groups on their surfaces, but that ceria particles containing increased tridentate content provide higher removal rates in chemical-mechanical polishing compositions. Thus, it is believed that optimizing the amount of tridentate hydroxyl groups on the surface of the ceria particles can improve polishing performance.

Because of the low pKa value of the tridentate hydroxyl groups, acid/base titration can be used to approximate the amount of tridentate hydroxyl groups present on the surface of ceria particles. In particular, ceria particles can be adjusted to an acidic pH with a suitable acid, and then titrated with a suitable base. For example, ceria particles can be adjusted to a pH of less than about 4, e.g., a pH of about 3.5, a pH of about 3, a pH of about 2.5, or a pH of about 2, with a suitable acid, e.g., $HClO_4$, HCl, or $HNO_3$, and then titrated with a suitable base, e.g., KOH, NaOH, or $NH_4OH$. If the ceria particles include tridentate hydroxyl groups on the surface of the particles, the normalized first derivative of the titration curve will include two peaks: a peak shoulder just below pH 6, and a dominant peak for the deprotonation of water at approximately pH 7. The peak shoulder just below pH 6 corresponds to the tridentate hydroxyl groups present on the surface of the ceria particles. The area of the peak shoulder can be calculated and used to determine the amount of base, e.g., KOH, NaOH, or $NH_4OH$, that reacted with the particles. The amount of tridentate hydroxyl groups can be calculated by assuming a 1:1 correspondence between the amount of base that reacted with the ceria particles and the amount of tridentate hydroxyl groups present on the surface of the ceria particles. The amount of tridentate hydroxyl groups can be divided by the BET surface area of the ceria particles to calculate the surface coverage of tridentate hydroxyl groups present on the surface of the ceria particles.

Preferably, the wet-process ceria particles have a surface that comprises tridentate hydroxyl groups. For example, the wet-process ceria particles can have a surface coverage of tridentate hydroxyl groups that is about $2.0 \times 10^{-5}$ moles/m$^2$ or more, e.g., about $2.1 \times 10^{-5}$ moles/m$^2$ or more, about $2.2 \times 10^{-5}$ moles/m$^2$ or more, about $2.3 \times 10^{-5}$ moles/m$^2$ or more, about $2.4 \times 10^{-5}$ moles/m$^2$ or more, about $2.5 \times 10^{-5}$ moles/m$^2$ or more, about $2.75 \times 10^{-5}$ moles/m$^2$ or more, about $3.0 \times 10^{-5}$ moles/m$^2$ or more, or about $3.25 \times 10^{-5}$ moles/m$^2$ or more. Alternatively, or in addition, the wet-process ceria particles can have a surface coverage of tridentate hydroxyl groups that is about $6.0 \times 10^{-5}$ moles/m$^2$ or less, e.g., about $5.5 \times 10^{-5}$ moles/m$^2$ or less, about $5.0 \times 10^{-5}$ moles/m$^2$ or less, about $4.5 \times 10^{-5}$ moles/m$^2$ or less, about $4.0 \times 10^{-5}$ moles/m$^2$ or less, about $3.5 \times 10^{-5}$ moles/m$^2$ or less, about $3.0 \times 10^{-5}$ moles/m$^2$ or less, about $2.75 \times 10^{-5}$ moles/m$^2$ or less, or about 2.5 moles/m$^2$ or less. Thus, the wet-process ceria particles can have a surface coverage of tridentate hydroxyl groups within a range bounded by any two of the aforementioned endpoints. For example, the wet-process ceria particles can have a surface coverage of tridentate hydroxyl groups that is between about $2.0 \times 10^{-5}$ moles/m$^2$ and about $6.0 \times 10^{-5}$ moles/m$^2$, e.g., about $2.3 \times 10^{-5}$ moles/m$^2$ to about $5.0 \times 10^{-5}$ moles/m$^2$, about $2.3 \times 10^{-5}$ moles/m$^2$ to about $4.0 \times 10^{-5}$ moles/m$^2$, about $2.3 \times 10^{-5}$ moles/m$^2$ to about $3.0 \times 10^{-5}$ moles/m$^2$, about $2.5 \times 10^{-5}$ moles/m$^2$ to about $3.75 \times 10^{-5}$ moles/m$^2$, or about $2.75 \times 10^{-5}$ moles/m$^2$ to about $4.0 \times 10^{-5}$ moles/m$^2$.

Preferably, the wet-process ceria particles have a surface coverage of tridentate hydroxyl groups that is about $2.3 \times 10^{-5}$ moles/m$^2$ or more, e.g., a surface coverage of tridentate hydroxyl groups that is about $2.35 \times 10^{-5}$ moles/m$^2$, about $2.4 \times 10^{-5}$ moles/m$^2$, about $2.5 \times 10^{-5}$ moles/m$^2$, or about $2.75 \times 10^{-5}$ moles/m$^2$.

The wet-process ceria particles also preferably have defects on the surface of the particles. Without wishing to be bound by any particular theory, it is believed that milling ceria particles can result in defects on the surface of the ceria particles, which defects also impact the performance of ceria particles in chemical-mechanical polishing compositions. In particular, ceria particles can be fractured as they are milled, which can expose less favored surface states. This process, known as relaxation, results in atoms near the surface of the ceria particles that have a limited ability to reorganize and return to a more favored state, leading to the formation of defects on the particle surface.

Raman spectroscopy can be used to quantitate the amount of defects present on the surface of particles. In particular, ceria particles can be centrifuged, the supernatant can be removed, and the ceria particles can be dried overnight at 60° C. A Raman spectrum can be collected on the dry powder using a suitable laser. For example, a Raman spectrum can be collected on the dry powder using a 532 nm laser. The most dominant peak on the Raman spectrum will be present at about 458 cm$^{-1}$, corresponding to the Ce-O vibration. A series of much smaller peaks after the peak at about 458 cm$^{-1}$ (e.g., peaks at 583 cm$^{-1}$, 660 cm$^{-1}$, and 1159 cm$^{-1}$) are sensitive to surface defectivity and will increase in intensity as defects on the surface of the ceria particles increase. The amount of surface defectivity can be approximated by dividing the intensity of the peak at about 458 cm$^{-1}$ by the intensity of the peak at about 583 cm$^{-1}$. As the amount of surface defects increases, the ratio between the intensity of the peak at about 458 cm$^{-1}$ and the intensity of the peak at about 583 cm$^{-1}$ becomes smaller. Unless specified otherwise, the Raman spectra used to calculate the ratios of the intensity of the peak at about 458 cm$^{-1}$ to the intensity of the peak at about 583 cm$^{-1}$ that are reported and claimed herein are generated using a 532 nm laser.

Preferably, a Raman spectrum of the wet-process ceria particles comprises a peak at about 458 cm$^{-1}$ and a peak at about 583 cm$^{-1}$, wherein the ratio of the intensity of the peak at about 458 cm$^{-1}$ to the intensity of the peak at about 583 cm$^{-1}$ is about 100 or less, e.g., about 90 or less, about 80 or less, about 75 or less, about 65 or less, or about 55 or less. More preferably, the ratio of the intensity of the peak at about 458 cm$^{-1}$ to the intensity of the peak at about 583 cm$^{-1}$ is about 65 or less, e.g., about 63 or less, about 60 or less, about 58 or less, about 55 or less, or about 50 or less. Alternatively, or in addition, the ratio of the intensity of the peak at about 458 cm$^{-1}$ to the intensity of the peak at about 583 cm$^{-1}$ can be about 2 or more, e.g., about 5 or more, about 7 or more, about 10 or more, about 12 or more, about 15 or more, about 20 or more, about 25 or more, or about 30 or more. Thus, the ratio of the intensity of the peak at about 458 cm$^{-1}$ to the intensity of the peak at about 583 cm$^{-1}$ can be any number within a range bounded by any two of the aforementioned endpoints. For example, the ratio of the intensity of the peak at about 458 cm$^{-1}$ to the intensity of the peak at about 583 cm$^{-1}$ can be about 2 to about 100, e.g., about 2 to about 65, about 4 to about 90, about 4 to about 65, about 6 to about 80, about 10 to about 65, about 25 to about 65, about 30 to about 65, or about 30 to about 55.

Wet-process ceria particles made according to the process described herein can be screened according to the methods described above to identify wet-process ceria particles having the preferred surface chemistry described herein, e.g., wet-process ceria particles having a median particle size of about 25 nm to about 150 nm and a particle size distribution of about 300 nm or more, wherein the wet-process ceria particles have a surface that comprises tridentate hydroxyl groups, and wherein the wet-process ceria particles have a surface coverage of tridentate hydroxyl groups that is about 2.0×10$^{-5}$ moles/m$^2$ or more, and/or wet-process ceria particles having a median particle size of about 25 nm to about 150 nm and a particle size distribution of about 300 nm or more, wherein a Raman spectrum of the wet-process ceria particles comprises a peak at about 458 cm$^{-1}$ and a peak at about 583 cm$^{-1}$, and wherein the ratio of the intensity of the peak at about 458 cm$^{-1}$ to the intensity of the peak at about 583 cm$^{-1}$ is about 100 or less. The polishing compositions described herein preferably comprise wet-process ceria particles made according to the process described herein and having the preferred surface chemistry described herein.

The polishing composition includes an aqueous carrier. The aqueous carrier contains water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The polishing composition optionally further comprises a pH-adjusting agent. The pH-adjusting agent can be any suitable pH-adjusting agent. For example, the pH-adjusting agent can be an alkyl amine, an alcohol amine, quaternary amine hydroxide, ammonia, or a combination thereof. In particular, the pH-adjusting agent can be triethanolamine, tetramethylammonium hydroxide (TMAH or TMA-OH), or tetraethylammonium hydroxide (TEAH or TEA-OH). Preferably, the pH-adjusting agent is triethanolamine.

Preferably, the pH of the polishing composition is about 1 to about 6, e.g., about 3 to about 5.5, about 3 to about 5, about 4 to about 6, about 4.5 to about 5.5, or about 5 to about 6. More preferably, the pH of the polishing composition is about 3.5 to about 5, e.g., about 4 or about 4.5.

The pH-adjusting agent can be present in the polishing composition in any suitable concentration. Desirably, the pH-adjusting agent is present in the polishing composition at a sufficient concentration to achieve and/or maintain the pH of the polishing composition within the pH ranges set forth herein, e.g., in the range of about 1 to about 6, or in the range of about 3.5 to about 5. For example, the pH-adjusting agent can be present in the polishing composition at a concentration of about 10 ppm to about 300 ppm, e.g., about 50 ppm to about 200 ppm, or about 100 ppm to about 150 ppm.

The polishing composition optionally further comprises one or more other additives. The polishing composition can comprise a surfactant and/or rheological control agent, including viscosity enhancing agents and coagulants (e.g., polymeric rheological control agents, such as, for example, urethane polymers), a dispersant, a biocide (e.g., KATHON™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally further comprises additional abrasive particles, i.e., particles other than wet-process ceria particles having a median particle size of about 25 nm to about 150 nm and a particle size distribution of about 300 nm or more.

The additional abrasive particles can be, for example, metal oxide abrasive particles of a different metal than the wet-process ceria particles, such as metal oxide abrasive particles of zirconia (e.g., zirconium oxide), titania (e.g., titanium dioxide), germania (e.g., germanium dioxide, germanium oxide), magnesia (e.g., magnesium oxide), nickel oxide, co-formed products thereof, or combinations thereof. The additional abrasive particles also can be organic particles of gelatin, latex, cellulose, polystyrene, or polyacrylate. Alternatively, the polishing composition can comprise wet-process ceria particles having a median particle size of about 25 nm to about 150 nm and a particle size distribution of about 300 nm or more, wherein the polishing composition does not include any additional abrasive particles.

The additional abrasive particles also can be metal oxide abrasive particles of ceria (e.g., cerium oxide) that are a different type of ceria than wet-process ceria particles, i.e., ceria particles that are not wet-process ceria particles, such as fumed ceria particles. Alternatively, the polishing composition can comprise wet-process ceria particles having a median particle size of about 25 nm to about 150 nm and a particle size distribution of about 300 nm or more, wherein the polishing composition does not include any additional ceria particles.

The polishing composition optionally comprises a mixture of different types of wet-process ceria particles, for example, wet-process ceria particles with the preferred surface chemistry described herein in combination with wet-process ceria particles with other than the preferred surface chemistry described herein, e.g., wet-process ceria particles that have a surface that does not comprise tridentate hydroxyl groups; wet-process ceria particles that have a surface that comprises tridentate hydroxyl groups, wherein the wet-process ceria particles have a surface coverage of tridentate hydroxyl groups that is less than about $2.0 \times 10^{-5}$ moles/m$^2$; wet-process ceria particles, wherein a Raman spectrum of the wet-process ceria particles does not comprise a peak at about 583 cm$^{-1}$; or wet-process ceria particles, wherein a Raman spectrum of the wet-process ceria particles comprises a peak at about 458 cm$^{-1}$ and a peak at about 583 cm$^{-1}$, and wherein the ratio of the intensity of the peak at about 458 cm$^{-1}$ to the intensity of the peak at about 583 cm$^{-1}$ is greater than about 100.

Alternatively, the polishing composition can comprise wet-process ceria particles having a median particle size of about 25 nm to about 150 nm and a particle size distribution of about 300 nm or more, and having the preferred surface chemistry described herein, wherein the polishing composition does not include any additional wet-process ceria particles. For example, the polishing composition can comprise wet-process ceria particles having a median particle size of about 25 nm to about 150 nm and a particle size distribution of about 300 nm or more, wherein the wet-process ceria particles have a surface that comprises tridentate hydroxyl groups, wherein the wet-process ceria particles have a surface coverage of tridentate hydroxyl groups that is about $2.0 \times 10^{-5}$ moles/m$^2$ or more, and wherein the polishing composition does not include any additional wet-process ceria particles. The polishing composition also can comprise wet-process ceria particles having a median particle size of about 25 nm to about 150 nm and a particle size distribution of about 300 nm or more, wherein a Raman spectrum of the wet-process ceria particles comprises a peak at about 458 cm$^{-1}$ and a peak at about 583 cm$^{-1}$, wherein the ratio of the intensity of the peak at about 458 cm$^{-1}$ to the intensity of the peak at about 583 cm$^{-1}$ is about 100 or less, and wherein the polishing composition does not include any additional wet-process ceria particles.

Desirably, the polishing composition can comprise wet-process ceria particles having a median particle size of about 25 nm to about 150 nm and a particle size distribution of about 300 nm or more, wherein the polishing composition does not include any additional wet-process ceria particles.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., wet-process ceria particles, aqueous carrier, etc.) as well as any combination of ingredients (e.g., wet-process ceria particles, aqueous carrier, etc.).

For example, the pH-adjusting agent (when included in the polishing composition) can be added to water at the desired concentration, and the wet-process ceria particles can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise wet-process ceria particles, a pH-adjusting agent (when included in the polishing composition), and water, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of polishing a substrate comprising (i) providing a substrate; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

In addition, the invention provides a method of polishing a substrate comprising (i) providing a substrate, wherein the substrate comprises a silicon layer; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the silicon layer on a surface of the substrate to polish the substrate.

More specifically, the invention provides a method of polishing a substrate comprising (i) providing a substrate, wherein the substrate comprises a silicon layer; (ii) providing a polishing pad; (iii) providing a chemical-mechanical polishing composition comprising (a) wet-process ceria particles having a median particle size of about 25 nm to about 150 nm and a particle size distribution of about 300 nm or more, and (b) an aqueous carrier; (iv) contacting the substrate with the polishing pad and the chemical-mechanical polishing composition; and (v) moving the polishing pad and the chemical-mechanical polishing composition relative to the substrate to abrade at least a portion of the silicon layer on a surface of the substrate to polish the substrate.

The polishing compositions of the invention are useful for polishing any suitable substrate. The polishing compositions are particularly useful in the polishing of a substrate comprising a silicon layer. For example, the silicon layer can be selected from a silicon oxide layer, a silicon nitride layer, a polysilicon layer, and combinations thereof. The polishing compositions of the invention are particularly useful in polishing a substrate comprising a silicon oxide layer, wherein the silicon oxide layer is a tetraethoxysilane (TEOS) layer.

Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The polishing composition is particularly well-suited for planarizing or polishing a substrate that has undergone shallow trench isolation (STI) processing. The substrate can further comprise at least one other layer, e.g., an insulating layer. The insulating layer can be a metal oxide, porous metal oxide, glass, organic polymer, fluorinated organic polymer, or any other suitable high or low-κ insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the silicon layer, or one or more of the substrate materials described herein, with the polishing composition and typically the polishing pad to polish the substrate. Any suitable polishing conditions can be used to polish a substrate according to the invention.

A substrate can be planarized or polished with the chemical-mechanical polishing composition in conjunction with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example demonstrates the effectiveness of a polishing composition including wet-process ceria particles having a median particle size of about 25 nm to about 150 nm and a particle size distribution of about 300 nm or more.

Tetraethoxysilane (TEOS) blanket wafers were polished with two polishing compositions (i.e., Polishing Compositions A and B). Each of Polishing Compositions A and B contained 0.4 wt. % wet-process ceria particles of the type listed in Table 2 and was pH-adjusted to pH 4.0 using triethanolamine. In particular, Table 2 lists the median particle size ("MPS") and the particle size distribution ("PSD") of the wet-process ceria particles, as determined by disc centrifuge, i.e., by CPS Disc Centrifuge Model DC24000UHR.

Table 2 also lists the surface coverage of tridentate hydroxyl groups present on the surface of the wet-process ceria particles ("Surface Tridentate Hydroxyl") included in Polishing Compositions A and B. More specifically, the abrasive particles included in Polishing Compositions A and B were characterized according to the content of tridentate hydroxyl groups present on the surface of the particles. The amount of tridentate hydroxyl groups present on the surface of the particles was determined in accordance with the procedure described herein. In particular, acid/base titration was used to approximate the amount of tridentate hydroxyl groups present on the surface of the particles. The particles were adjusted to pH 2.5 with $HClO_4$, and then titrated with KOH. The area of the peak shoulder just below pH 6 was calculated and used to determine the amount of tridentate hydroxyl groups present on the surface of the particles. The amount of the tridentate hydroxyl groups present on the surface of the particles was divided by the BET surface area of the particles to determine the surface coverage of tridentate hydroxyl groups (moles/m$^2$). The wet-process ceria particles included in Polishing Composition A had a BET surface area of about 30 m$^2$/g, and the wet-process ceria particles included in Polishing Composition B had a BET surface area of about 30.8 m$^2$/g.

Table 2 also lists the ratio of the intensity of the peak at about 458 cm$^{-1}$ to the intensity of the peak at about 583 cm$^{-1}$ ("Peak Ratio") on Raman spectra of the wet-process ceria particles included in Polishing Compositions A and B. More specifically, the ratio of the intensity of the peak at about 458 cm$^{-1}$ to the intensity of the peak at about 583 cm$^{-1}$ for the particles included in Polishing Compositions 1A and 1B was determined in accordance with the procedure described herein. In particular, the particles were centrifuged, the supernatant was removed, and the particles were dried overnight at 60° C. Raman spectra were collected on the dry powder using a 532 nm laser.

The TEOS blanket wafers were polished with Polishing Compositions A and B under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket TEOS were determined in Å/min. The results are summarized in Table 2.

TABLE 2

Blanket Silicon Oxide Removal Rate as a Function of Particle Size and Surface Chemistry of Wet-Process Ceria Particles

| Polishing Composition | Wet-Process Ceria Particles | | | | Blanket TEOS Removal Rate (Å/min) |
|---|---|---|---|---|---|
| | MPS (nm) | Surface Tridentate Hydroxyl (moles/m$^2$) | Peak Ratio | PSD (nm) | |
| A (comparative) | 54 | $1.76 \times 10^{-6}$ | 71.4 | about 200 | 282 |
| B (inventive) | 73 | $2.3 \times 10^{-5}$ | 54.8 | about 380 | 1055 |

These results demonstrate that a polishing composition comprising wet-process ceria particles according to the invention is particularly effective for polishing substrates comprising a silicon layer, such as a silicon oxide layer, i.e., TEOS. In particular, Polishing Composition B exhibited a blanket TEOS removal rate that was more than three times greater than the blanket TEOS removal rate provided by Polishing Composition A, which did not contain wet-process ceria particles according to the invention, but contained wet-process ceria particles having a particle size distribution that was significantly less than 300 nm. Thus, these results demonstrate the improvement in removal rate provided by wet-process ceria particles having a broad particle size distribution and optimized surface chemistry.

EXAMPLE 2

This example demonstrates the effectiveness of the inventive polishing composition in a Stop-on-Poly (SoP) polishing application.

Two identical polishing compositions were prepared having a high molecular weight polyethylene glycol polymer for inhibiting polysilicon removal rate. Slurry 2A had the abrasive ceria particle having a median particle size of about 25 nm to about 150 nm and a particle size distribution of about 300 nm or more, having a surface that comprises tridentate hydroxyl groups and having a surface coverage of tridentate hydroxyl groups that is about $2.0 \times 10^{-5}$ moles/m$^2$ or more. Slurry 2 had a commercial wet process ceria particle with a primary average particle size of 60 nm (Solvay, Houston, Tex.). Slurry 2B was designed to be a SoP slurry composition, having a good polishing rate for silicon oxide, but a low polishing rate for polysilicon. The two slurry compositions were used to polish blanket silicon oxide wafers, blanket polysilicon wafers and 100 μm×100 μm POP (oxide top film with polysilicon film underneath) patterned wafers. The polishing experiments were done using a 300 mm Reflexion® (Applied Materials, Inc., Santa Clara, Calif.) polishing tool, with a IC1010® pad (Dow Chemical, Midland, Mich.) and a Saesol C7 conditioner (Saesol Diamond Ind. Co., Ltd, South Korea), using the following parameters; 93 rpm Platen Speed, 87 rpm Head Speed, 250 ml/min Slurry Flow. The results, shown in Table 3, demonstrate that composition 2A had a much higher removal rate of silicon oxide, while not having any adverse effect on the suppressed polysilicon polishing rate or dishing, when compared to composition 2B.

TABLE 3

Polishing results for a SoP application.

|  | 2A (Inventive) | 2B (Comparative) |
|---|---|---|
| TEOS Removal Rate (Å/min) | 4654 | 2187 |
| Blanket Poly Removal Rate (Å/min) | 10 | 11 |
| 100 μm × 100 μm Poly Loss (Å) | 6 | 8 |
| 100 μm × 100 μm Dishing (Å) | 325 | 262 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) wet-process ceria particles having a median particle size of about 25 nm to about 150 nm and a particle size distribution of about 300 nm or more, wherein the wet-process ceria particles have a surface that comprises tridentate hydroxyl groups and has a surface coverage of tridentate hydroxyl groups that is about $2.0 \times 10^{-5}$ moles/m$^2$ or more, and
   (b) an aqueous carrier.

2. The chemical-mechanical polishing composition of claim 1, wherein the wet-process ceria particles have a median particle size of about 40 nm to about 100 nm.

3. The chemical-mechanical polishing composition of claim 1, wherein the wet-process ceria particles have a median particle size of about 60 nm to about 80 nm.

4. The chemical-mechanical polishing composition of claim 1, wherein the wet-process ceria particles have a particle size distribution of about 350 nm or more.

5. The chemical-mechanical polishing composition of claim 4, wherein the wet-process ceria particles have a particle size distribution of about 375 nm or more.

6. The chemical-mechanical polishing composition of claim 1, wherein the wet-process ceria particles have a surface coverage of tridentate hydroxyl groups that is about $2.0 \times 10^{-5}$ moles/m$^2$ and about $6.0 \times 10^{-5}$ moles/m$^2$.

7. The chemical-mechanical polishing composition of claim 6, wherein the wet-process ceria particles have a surface coverage of tridentate hydroxyl groups that is about $2.3 \times 10^{-5}$ moles/m$^2$ or more.

8. The chemical-mechanical polishing composition of claim 1, wherein a Raman spectrum of the wet-process ceria particles comprises a peak at about 458 cm$^{-1}$ and a peak at about 583 cm$^{-1}$, and wherein the ratio of the intensity of the peak at about 458 cm$^{-1}$ to the intensity of the peak at about 583 cm$^{-1}$ is about 100 or less.

9. The chemical-mechanical polishing composition of claim 8, wherein the ratio of the intensity of the peak at about 458 cm$^{-1}$ to the intensity of the peak at about 583 cm$^{-1}$ is about 65 or less.

10. The chemical-mechanical polishing composition of claim 1, wherein the wet-process ceria particles are present in the polishing composition at a concentration of about 0.1 wt. % to about 1 wt. %.

11. The chemical-mechanical polishing composition of claim 10, wherein the wet-process ceria particles are present in the polishing composition at a concentration of about 0.2 wt. % to about 0.6 wt. %.

12. The chemical-mechanical polishing composition of claim 1, further comprising a pH-adjusting agent.

13. The chemical-mechanical polishing composition of claim 12, wherein the pH-adjusting agent is selected from an alkyl amine, an alcohol amine, a quaternary amine hydroxide, ammonia, and combinations thereof.

14. The chemical-mechanical polishing composition of claim 12, wherein the pH-adjusting agent is triethanolamine.

15. The chemical-mechanical polishing composition of claim 1, wherein the pH of the polishing composition is about 1 to about 6.

16. The chemical-mechanical polishing composition of claim 15, wherein the pH of the polishing composition is about 3.5 to about 5.

17. A method of polishing a substrate comprising:
(i) providing a substrate;
(ii) providing a polishing pad;
(iii) providing the chemical-mechanical polishing composition of claim 1;
(iv) contacting the substrate with the polishing pad and the chemical-mechanical polishing composition; and
(v) moving the polishing pad and the chemical-mechanical polishing composition relative to the substrate to abrade at least a portion of the substrate to polish the substrate.

18. A method of polishing a substrate comprising:
(i) providing a substrate, wherein the substrate comprises a silicon layer;
(ii) providing a polishing pad;
(iii) providing the chemical-mechanical polishing composition of claim 1;
(iv) contacting the substrate with the polishing pad and the chemical-mechanical polishing composition; and
(v) moving the polishing pad and the chemical-mechanical polishing composition relative to the substrate to abrade at least a portion of the silicon layer on a surface of the substrate to polish the substrate.

19. The method of claim 18, wherein the silicon layer is selected from a silicon oxide layer, a silicon nitride layer, a polysilicon layer, and combinations thereof.

20. The method of claim 18, wherein the silicon layer is a tetraethoxysilane (TEOS) layer.

\* \* \* \* \*